United States Patent
Amirante et al.

(10) Patent No.: US 12,424,292 B2
(45) Date of Patent: Sep. 23, 2025

(54) MASKING TECHNIQUES FOR MEMORY APPLICATIONS

(71) Applicant: Arm Limited, Cambridge (GB)

(72) Inventors: Ettore Amirante, Nice (FR); Vivek Asthana, Greater Noida (IN); Yew Keong Chong, Austin, TX (US); Jean-Christophe Vial, Biot - Sophia Antipolis (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 18/219,289

(22) Filed: Jul. 7, 2023

(65) Prior Publication Data

US 2024/0304265 A1    Sep. 12, 2024

(30) Foreign Application Priority Data

Mar. 8, 2023    (IN) .............................. 202341015432

(51) Int. Cl.
*G11C 7/18*    (2006.01)
*G11C 17/12*    (2006.01)

(52) U.S. Cl.
CPC .............. *G11C 17/126* (2013.01); *G11C 7/18* (2013.01)

(58) Field of Classification Search
CPC .......... G11C 17/126; G11C 7/18; H10B 20/34
See application file for complete search history.

(56) References Cited

U.S. PATENT DOCUMENTS

2022/0384463 A1* 12/2022 Lim ...................... H10B 20/38
2024/0155850 A1* 5/2024 Yao ..................... G11C 11/1673

* cited by examiner

*Primary Examiner* — Xiaochun L Chen
(74) *Attorney, Agent, or Firm* — Pramudji Law Group PLLC; Ari Pramudji (57) ABSTRACT

Various implementations described herein are related to a device including a bitcell having a bitcell layout with a first metal layer, a second metal layer and a via programming layer. The device may have a via marking layer provided in the bitcell layout for the bitcell, and the via marking layer controls optical proximity correction of the first metal layer and the second metal layer.

20 Claims, 8 Drawing Sheets

MASKING TECHNIQUES FOR MEMORY APPLICATIONS

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit architectures, conventional memory circuitry may have multiple bitcells that are organized in a matrix with wordlines (WL), bitlines (BL) and source lines (SL) that allow selection of each bitcell. Typically, in conventional read-only memory (ROM) devices, many masks are needed for each metal layer during programming events and/or reprogramming events, which can be inefficient and cumbersome. Also, in various instances of programming and/or reprogramming ROM devices, the metal layers are also affected due to Optical Proximity Correction (OPC), wherein alignment of the metal layer masks can affect via positioning when programming/reprogramming ROM devices. Thus, there exists a need for more efficient fabrication schemes that reduce a number of masks needed to program and/or reprogram ROM devices.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to via masking schemes and techniques for various memory related applications in physical designs. Also, in some implementations, various via masking schemes and techniques described herein provide for a novel bitcell layout that uses a via marking layer to reduce a number of metal masks needed for forming metal layers. In some implementations, various via masking schemes and techniques described herein may provide for some memory masking techniques that reduce a number of programming masks for various types of via memory, including, e.g., via ROM (via read-only memory). As such, various via masking schemes and techniques described herein may provide various techniques that reduce a number of programming masks for metal layers in various memory based applications.

Various implementations of via masking schemes and techniques for memory applications will be described herein in FIGS. 1A-1B, 2-3, 4A-4B and 5-6.

Figure 1A:
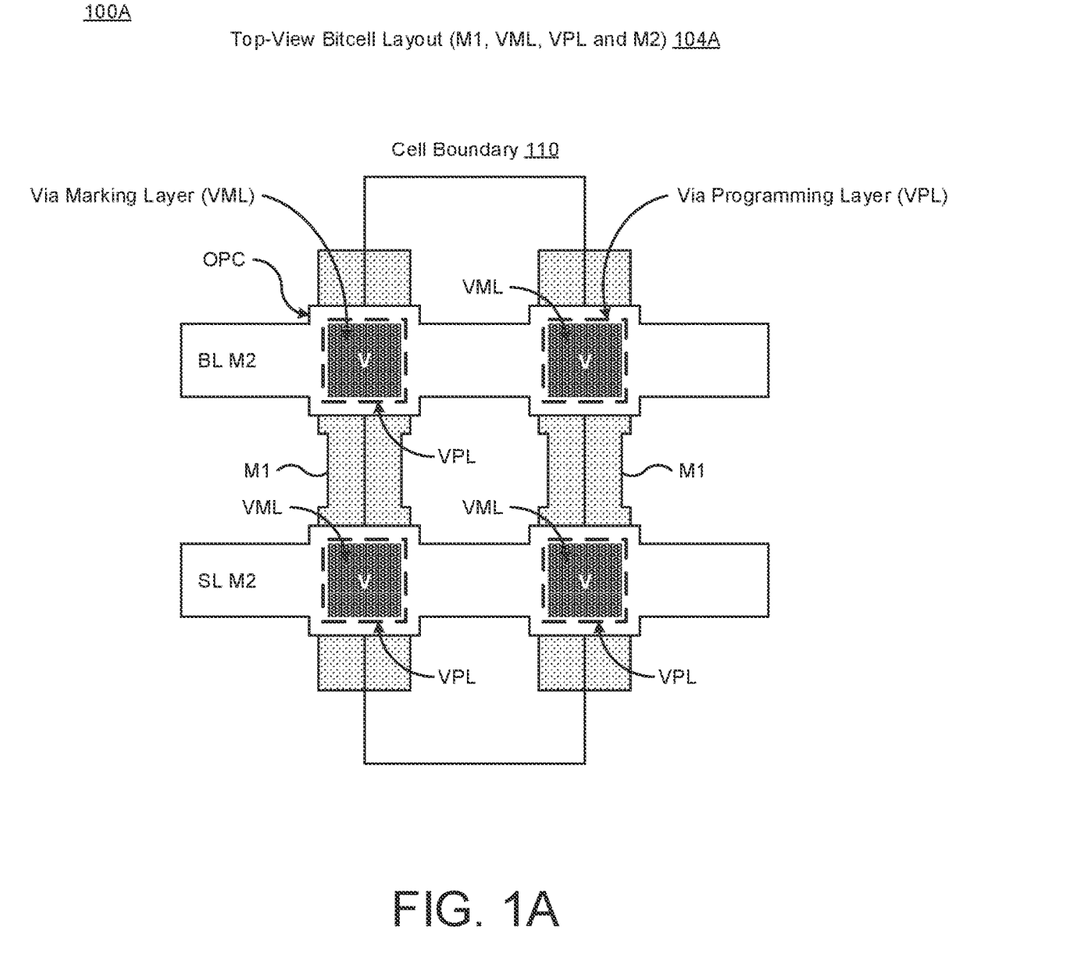
FIGS. 1A-1B illustrate various view diagrams of a bitcell layout for via masking in accordance with various implementations described herein.
Figure 1B:
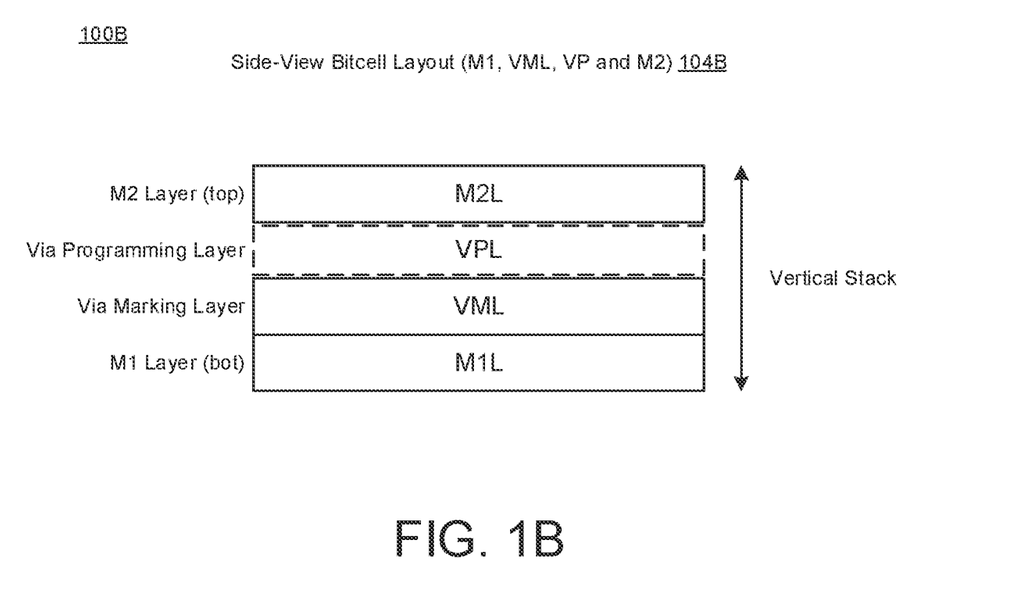

FIGS. 1A-1B illustrate various top-side view diagrams of a bitcell layout for via masking in accordance with various implementations described herein. In particular, as shown in FIG. 1A, a top-view diagram 100A is provided for a bitcell layout 104A, and also, FIG. 1B shows a side-view diagram 100B of a bitcell layout 104B.

In various implementations, bitcell layouts 104A, 104B provide the via marking layer (VML) for fabricating a bitcell as a via memory device with various integrated circuit (IC) components arranged and coupled together as an assemblage or some combination of parts that provide for physical circuit designs and various related structures. In various instances, a method of designing, providing and fabricating the bitcell layouts 104A, 104B as an integrated device may involve use of various circuit components and/or structures described herein so as to thereby implement various via masking techniques associated therewith. Also, bitcell layouts 104A, 104B may be integrated with memory circuitry and/or related components on a single chip, and bitcell layouts 104A, 104B may be implemented in embedded devices for automotive, mobile, computer, server and IoT applications.

As shown in FIG. 1A, the bitcell layout 104A may provide for a bitcell structure that uses via masking schemes and techniques for various circuit applications. Also, the bitcell layout 104A may define a structure of a bitcell with/by a cell boundary 110, and the bitcell layout 104A may include a first metal layer (M1), a second metal layer (M2), and a via programming layer (VPL). Also, the bitcell layout 104A may have a via marking layer (VML) that is provided in the bitcell layout 104A for the bitcell. Also, the via marking layer (VML) may be configured to control optical proximity correction (OPC) of the first metal layer (M1) and the second metal layer (M2). Also, the via marking layer (VML) may control the optical proximity correction (OPC) of the first metal layer (M1) and the second metal layer (M2), e.g., by decoupling the optical proximity correction (OPC) of the first metal layer (M1) and the second metal layer (M2) from the via programming layer (VPL).

In various implementations, masks may be used to program or reprogram the bitcell, and the masks may have one or more masks for the via programming layer (VPL) without any masks for the first metal layer (M1) and/or without any masks for the second metal layer (M2). Also, in some applications, one or more vias (V) may be formed during programming and/or reprogramming the bitcell between the first metal layer (M1) and the second metal layer (M2) with a single via programming layer provided in the bitcell layout 104A. In addition, the via marking layer (VML) may be disposed between the first metal layer (M1) and the via programming layer (VPL). Also, the first metal layer (M1) may be disposed below the second metal layer (M2), and the via programming layer (VPL) may be disposed between the via marking layer (VML) and the second metal layer (M2). Also, the first metal layer (M1) may also be referred to as M1L, and the second metal layer (M2) may be referred to as M2L. In addition, the second metal layer (M2) may include a bitline (BL M2) and a source line (SL M2) for various memory based circuitry.

As shown in FIG. 1B, the bitcell layout 104B may provide a vertical stack of the first metal layer (M1 or M1L) as bottom layer (bot), and the second metal layer (M2 or M2L) as top layer (top) disposed above bottom M1L. Also, via marking layer (VML) may be formed and/or disposed above M1L, and via programming layer (VPL) may be formed and/or disposed above the VML. Also, the VML may be formed and/or disposed between M1L and VPL, and the VPL may be formed and/or disposed between VML and M2L. Also, VPL is shown as a dashed line because not every double or quad via position is necessary to program and/or reprogram a bitcell with logic 0/1 states. These concepts are described in greater detail herein, e.g., in reference to FIGS. 4A-4B.

In various implementations, the bitcell layout 104A may refer to via ROM bitcell programming or reprogramming to set the logic state of the bitcell to logic 1 or 0. In some applications, a via ROM bitcell may be formed with one device having its gate coupled to a wordline (WL), its source (S) coupled to a first metal shape (e.g., M1) and its drain (D) coupled to a second metal shape (e.g., M1). Also, the position of the programming via layer (VPL) may vary so as to enable/disable current flow among the bitline (BL M2) and the source line (SL M2), when the WL is turned on. In reference to programming logic 1 state, some current may flow among the BL and SL, when the WL is turned on, and also, in reference to programming a logic 0 state, due to a missing via, no current flows among the BL and SL, when the WL is turned on. These concepts are described in greater detail herein, e.g., in reference to FIGS. 4A-4B.

Also, in reference to programming layers versus masks in via ROM, the position of the via programming layer (VPL) may vary so as to cover none or one or more or all possible combinations of via connections corresponding to logical 0/1 states. In some instances, when programming a bitcell, the via marking layer (VML) may be used to program and/or reprogram with double or quad pattern processing, wherein the first metal layer (M1) and the second metal layer (M2) may be affected due to Optical Proximity Correction (OPC) between the metal layers (M1/M2). In this instance, the via marking layer (VML) provides for a single via programming layer (VPL) to be used for double or quad processing of the via in the instances, of programming or reprogramming logic 0/1 states.

Thus, various via masking schemes and techniques described herein provide for decoupling via programming and/or reprogramming from metal OPC. For instance, as described herein, the various via masking schemes and techniques use a dedicated via marking layer (VML) to mark one or more or all possible positions of the programming via, wherein the dedicated via marking layer (VML) is used for generating the OPC of adjacent metal layers (e.g., M1/M2). Thus, this via marking layer (VML) technique makes the OPC of the metal layers (M1/M2) independent from the programming vias, and the actual via programming layer (VPL) may then be used to process the programming via. As a result, since the via marking layer (VML) provides for using only a single via programming layer (VPL), the number of via programming masks is reduced.

Figure 2:
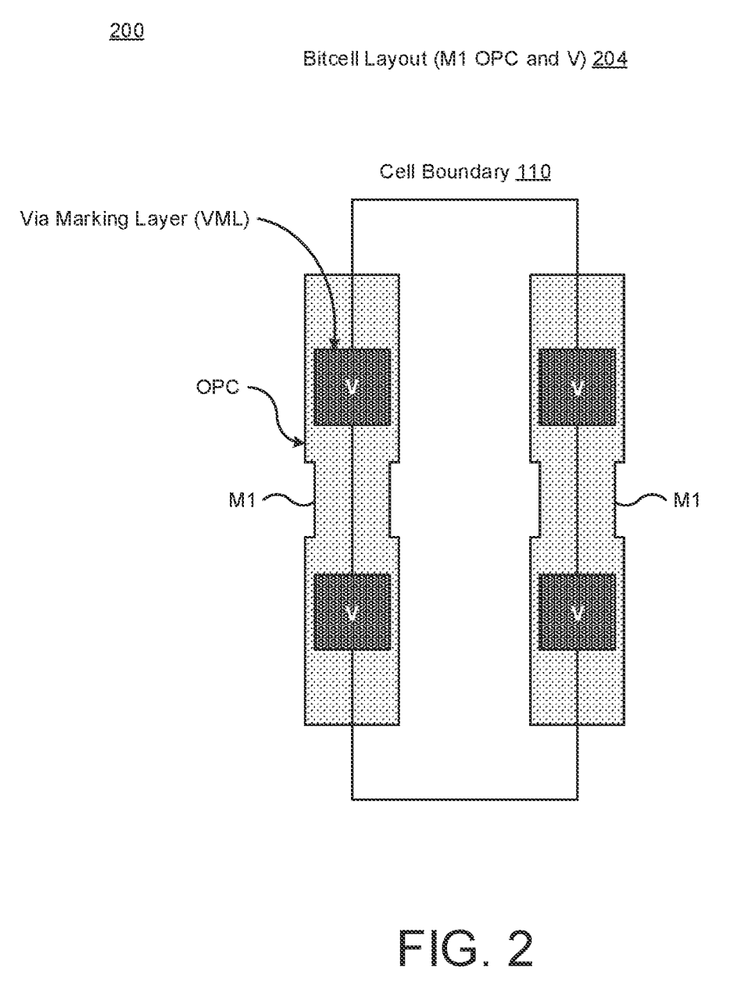
FIGS. 2-3 illustrate various view diagrams of a bitcell layout for via masking in accordance with various implementations described herein.
Figure 3:
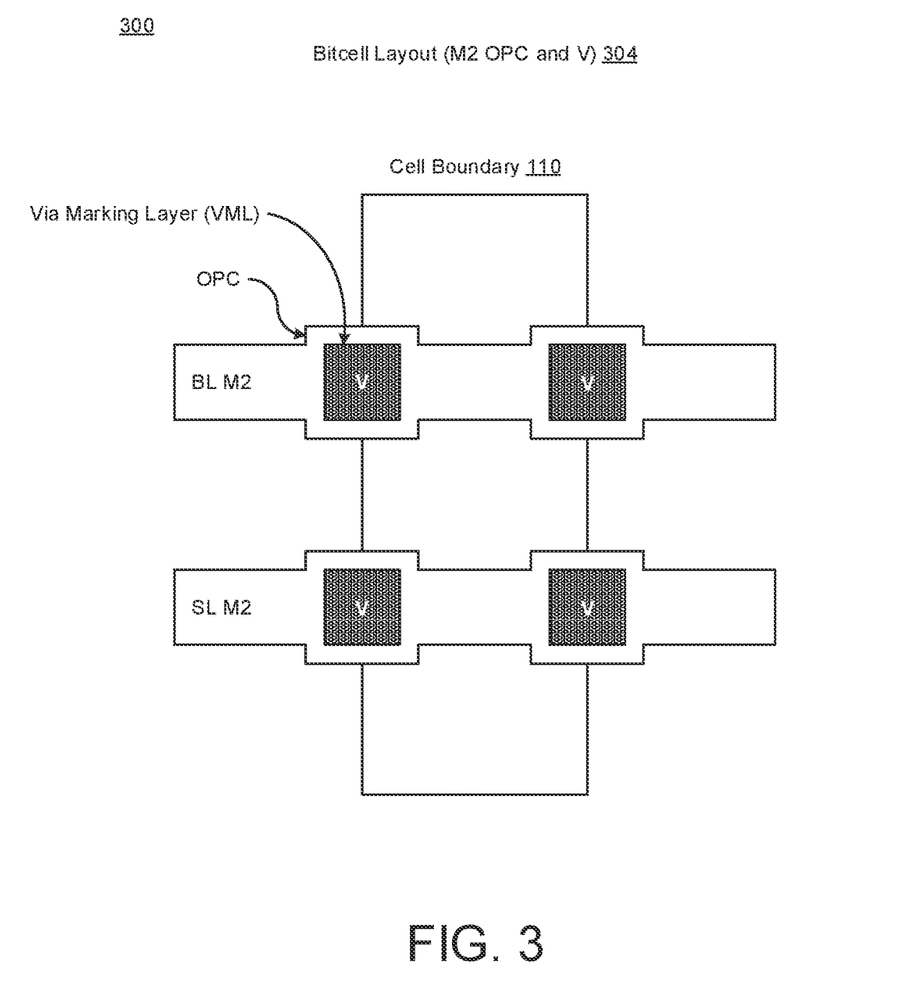

FIGS. 2-3 illustrate various view diagrams of a bitcell layout for via masking in accordance with various implementations described herein. In particular, in reference to M1 OPC, FIG. 2 shows a bitcell layout 204 with M1 positioning with via marking layer (VML), and also, in reference to M2 OPC, FIG. 3 shows another bitcell layout 304 with M2 positioning with via marking layer (VML).

In various implementations, the bitcell layouts 204, 304 provide the via marking layer (VML) for fabricating a bitcell as a via memory device with various integrated circuit (IC) components arranged and coupled together as an assemblage or some combination of parts that provide for physical circuit designs and various related structures. In various instances, a method of designing, providing and fabricating the bitcell layouts 204, 304 as an integrated device may involve use of various circuit components and related structures described herein so as to thereby implement various via masking techniques associated therewith. Also, bitcell layouts 204, 304 may be integrated with memory circuitry and/or related components on a single chip, and bitcell layouts 204, 304 may be implemented in embedded devices for automotive, mobile, computer, server and IoT applications.

As shown in FIG. 2, the first metal layer (M1) may be provided in bitcell layout 204 for a bitcell with a first metal mask, and as shown in FIG. 3, the second metal layer (M2) may be provided in bitcell layout 304 with a second metal mask. Also, as shown in FIGS. 2-3, the via marking layer (VML) may be provided in the bitcell layouts 204, 304, and as such, the via programming layer (VPL) may also be provided in the bitcell layouts 204, 304 for the bitcell with a single via programming mask. As described herein, the via marking layer (VML) may be used to control optical proximity correction (OPC) of the first metal layer (M1) and the second metal layer (M2).

Also, when combined, the bitcell layouts 204, 304 may define the structure of a bitcell by way of the cell boundary 110, and the bitcell layouts 204, 304 may have the first metal layer (M1), the second metal layer (M2), and the via programming layer (VPL). Also, the combined bitcell layouts 204, 304 may have the via marking layer (VML) as provided in the combined bitcell layouts 204, 304 for the bitcell. Also, the via marking layer (VML) may be disposed between the first metal layer (M1) and the via programming layer (VPL), and also, the first metal layer (M1) may be disposed below the second metal layer (M2), wherein the via programming layer (VPL) is disposed between the via marking layer (VML) and the second metal layer (M2). Also, the via marking layer (VML) may be configured to control the optical proximity correction (OPC) of the first metal layer (M1) and the second metal layer (M2). Also, the via marking layer (VML) may control the optical proximity correction (OPC) of the first metal layer (M1) and the second metal layer (M2), e.g., by decoupling the optical proximity correction (OPC) of the first metal layer (M1) and the second metal layer (M2) from the via programming layer (VPL).

Also, in reference to the bitcell layout 204 in FIG. 2, the ends of the first metal layer (M1) may include larger OPC regions disposed adjacent (or near) the cell boundary 110 for a bitcell. Also, these larger OPC regions at the ends may be larger than the middle region of the M1 layer, wherein these larger OPC regions at the ends of the M1 layer may be used to control OPC for the M1 layer in that one or more vias (V) may be formed and/or located within the larger OPC regions at the ends of the M1 layer.

Also, in reference to the bitcell layout 304 in FIG. 3, the second metal layer (M2) may have multiple larger OPC regions disposed adjacent (or near) the cell boundary 110 in the middle region of the M2 layer. Also, these larger OPC regions in the M2 layer may be larger than the middle region of the M2 layer, wherein these larger OPC regions in the M2 layer may be used to control OPC for the M2 layer in that one or more vias (V) are formed and/or located within the larger OPC regions of the M2 layer.

In some implementations, the via marking layer (VML) allows for programming of a bitcell with a single via programming mask for the via programming layer (VPL), and also, the via marking layer (VML) allows for programming of the bitcell with only the single via programming mask for the via programming layer (VPL). Also, the via marking layer (VML) may be used to control the optical proximity correction (OPC) of the first metal layer (M1) and the second metal layer (M2) by decoupling the optical proximity correction (OPC) of the first metal layer (M1) and the second metal layer (M2) from the via programming layer (VPL). Also, masks used to program and/or reprogram the bitcell may have one or more masks for the via programming layer (VPL) without any masks for the first metal layer (M1) and/or without any masks for the second metal layer (M2). Also, one or more vias (V) may be formed during programming and/or reprogramming of the bitcell between the first metal layer (M1) and the second metal layer (M2) with the single via programming layer (VPL) provided in the combined bitcell layouts 204, 304.

Figure 4A:
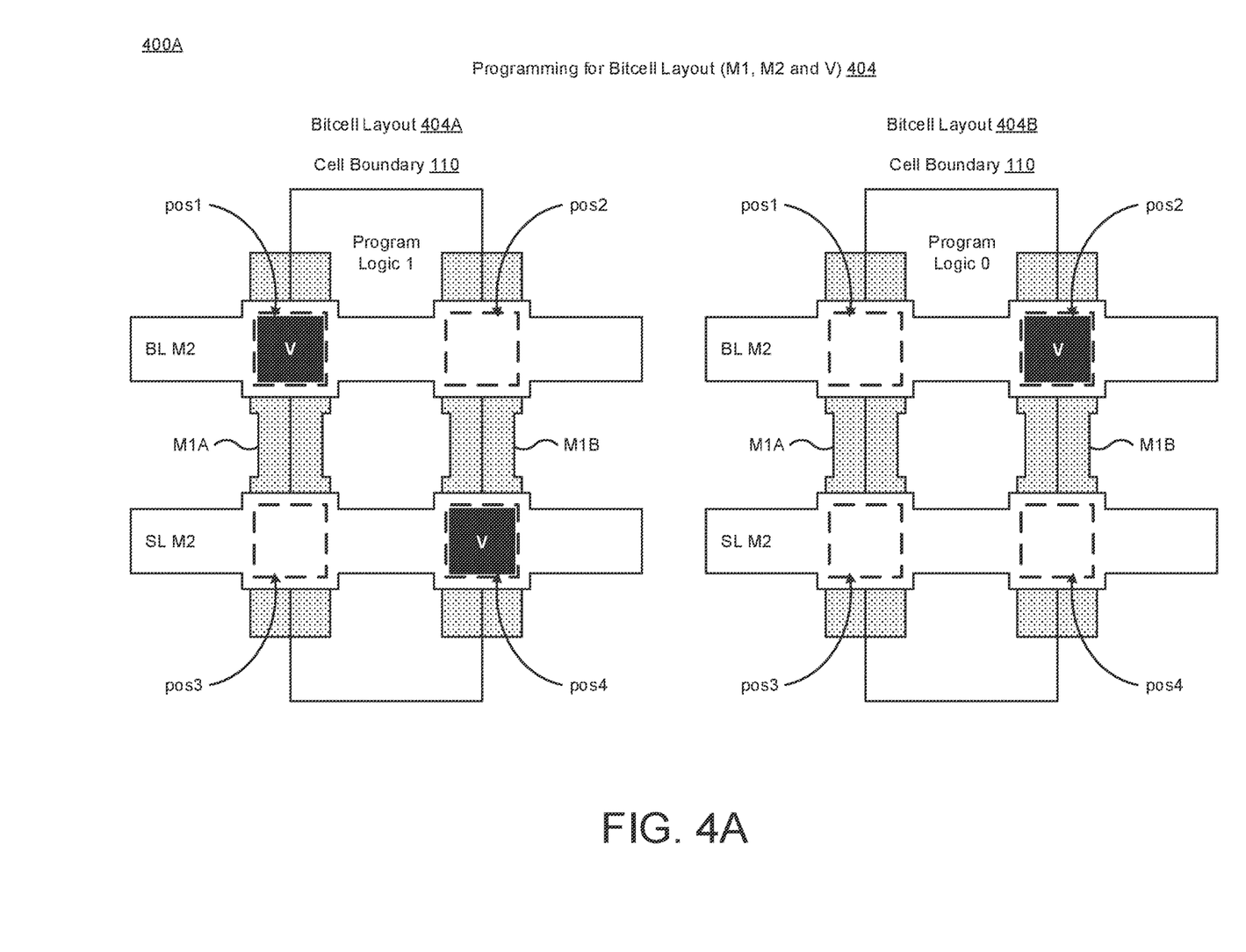
FIGS. 4A-4B illustrate various diagrams of programming for a bitcell layout in accordance with various implementations described herein.
Figure 4B:
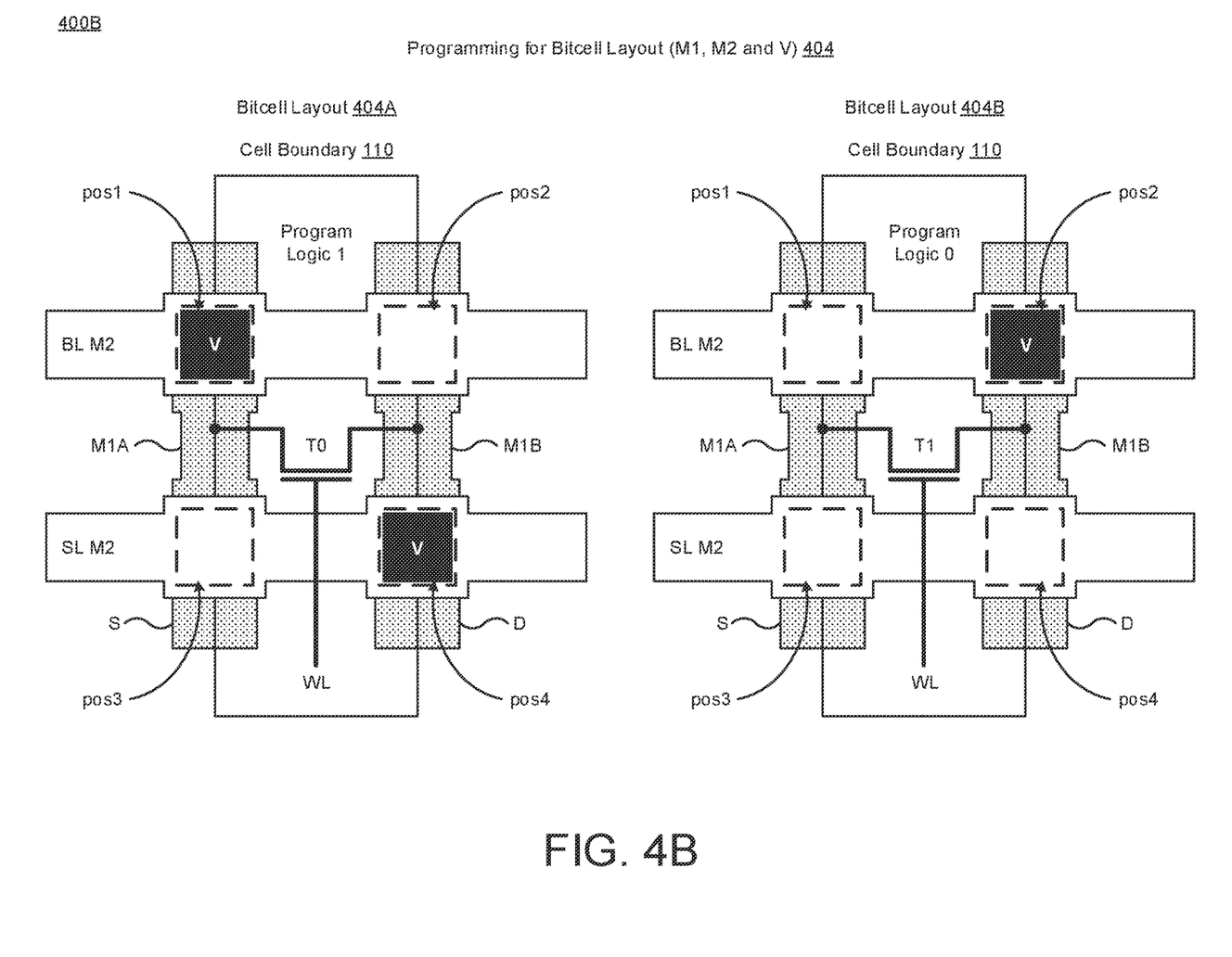

FIGS. 4A-4B illustrate various diagrams of programming for bitcell layout 404 in accordance with implementations described herein. FIG. 4A shows a diagram 400A of programming logic one (1) state for bitcell layout 404A and also programming logic zero (0) state for bitcell layout 404B. Also, FIG. 4B shows a diagram 400B of programming logic one (1) state for bitcell layout 404A in reference to transistor (T0) and programming logic zero (0) state for bitcell layout 404B in reference to transistor (T1).

In various implementations, bitcell layouts 404A, 404B use the via marking layer (VML) for fabricating a bitcell as a via memory device with various integrated circuit (IC) components arranged and coupled together as an assemblage or some combination of parts that provide for physical circuit designs and various related structures. In various instances, a method of designing, providing and fabricating the bitcell layouts 404A, 404B as an integrated device may involve use of various circuit components and/or structures described herein so as to thereby implement various via masking techniques associated therewith. Also, bitcell layouts 404A, 404B may be integrated with memory circuitry and/or related components on a single chip, and bitcell layouts 404A, 404B may be implemented in embedded devices for automotive, mobile, computer, server and IoT applications.

In some implementations, as shown in FIG. 4A, the bitcell layouts 404, 404A, 404B may refer to via ROM bitcell programming and/or reprogramming so as to set a logic state of a bitcell to logic 1 or 0. In various applications, the bitcell layouts 404A, 404B may include the first metal layer (M1) with a first metal shape (M1A) and a second metal shape (M1B). Also, the bitcell layouts 404A, 404B may include the second metal layer (M2) with the bitline (BL M2) and the source line (SL M2). Also, the via marking layer (VML) may be used to identify and/or locate multiple via positions (pos1, pos2, pos3, pos4), including, e.g., a first via position (pos1), a second via position (pos2), a third via position (pos3), and a fourth via position (pos4), where the first metal layer shapes (M1A, M1B) cross the second metal layer shapes (BL M2, SL, M2). In various applications, the M1/M2 shapes may be referred to as conductive lines, wires, traces, and/or similar.

In some implementations, as shown in FIG. 4B, the bitcell layouts 404, 404A, 404B may refer to via ROM bitcell programming and/or reprogramming so as to set a logic state of the bitcell to logic 1 or 0. In various applications, a via ROM bitcell may be formed with one device (T0/T1) having its gate coupled to a wordline (WL), its source (S) coupled to a first metal shape (M1A), and its drain (D) coupled to a second metal shape (M1B). In some instances, the bitcell layout 404A shows an example of via positioning to program logic one (1) with a via in pos1 and another via in pos4, and also, the bitcell layout 404B shows an example of via positioning to program logic zero (0) with a via in pos2.

In some instances, the bitcell layout 404A has transistor (T0) coupled between M1A and M1B along with its gate coupled to the wordline (WL). As shown in bitcell layout 404A, BL M2 is coupled to M1A with a via in pos1, and also, SL M2 is coupled to M1B with a via in pos4, which may be used to program a logic one (1) due to current flow between BL and SL. Also, in some instances, the bitcell layout 404B has transistor (T1) coupled between M1A and M1B along with its gate coupled to the wordline (WL). As shown in bitcell layout 404A, BL M2 is coupled to M1B with a via in pos2, which may be used to program a logic zero (0) due to no current flow between BL and SL.

Also, position of the via programming layer (VPL) may vary to enable/disable current flow among the bitline (BL M2) and the source line (SL M2), when the WL is turned on. In reference to programming logic 1 state as in bitcell layout 404A, some current may flow among the BL and SL, when the WL is turned on. Also, in reference to programming a logic 0 state as in bitcell layout 404B, with only a via in pos2, and due to a missing via, e.g., in pos3, no current flows among the BL and SL, when the WL is turned on.

In reference to via ROM bitcell programming, a logic one (1) state and a logic zero (0) state may be programmed in various via positions, e.g., as long as current flows between the BL and SL for the logic one (1) state, and also, e.g., no current flows between the BL and SL for logic zero (0) state. As shown in FIG. 4B, a via ROM bitcell may be made with/by one device (T0/T1) having its gate connected to a wordline (WL), its source (S) connected to a first metal shape (e.g., M1A), and its drain (D) connected to a second metal shape (e.g., M1B). Also, the position of the via programming layer (VPL) may vary to enable/disable current flow between the bitline (BL) and source line (SL), when the WL is turned on. In an example of programming logic one (1), current flows between BL and SL, when the WL is turned on. In an example of programming logic zero (0), due to one or more missing vias, no current flows between BL and SL, when the WL is turned on.

Figure 5:
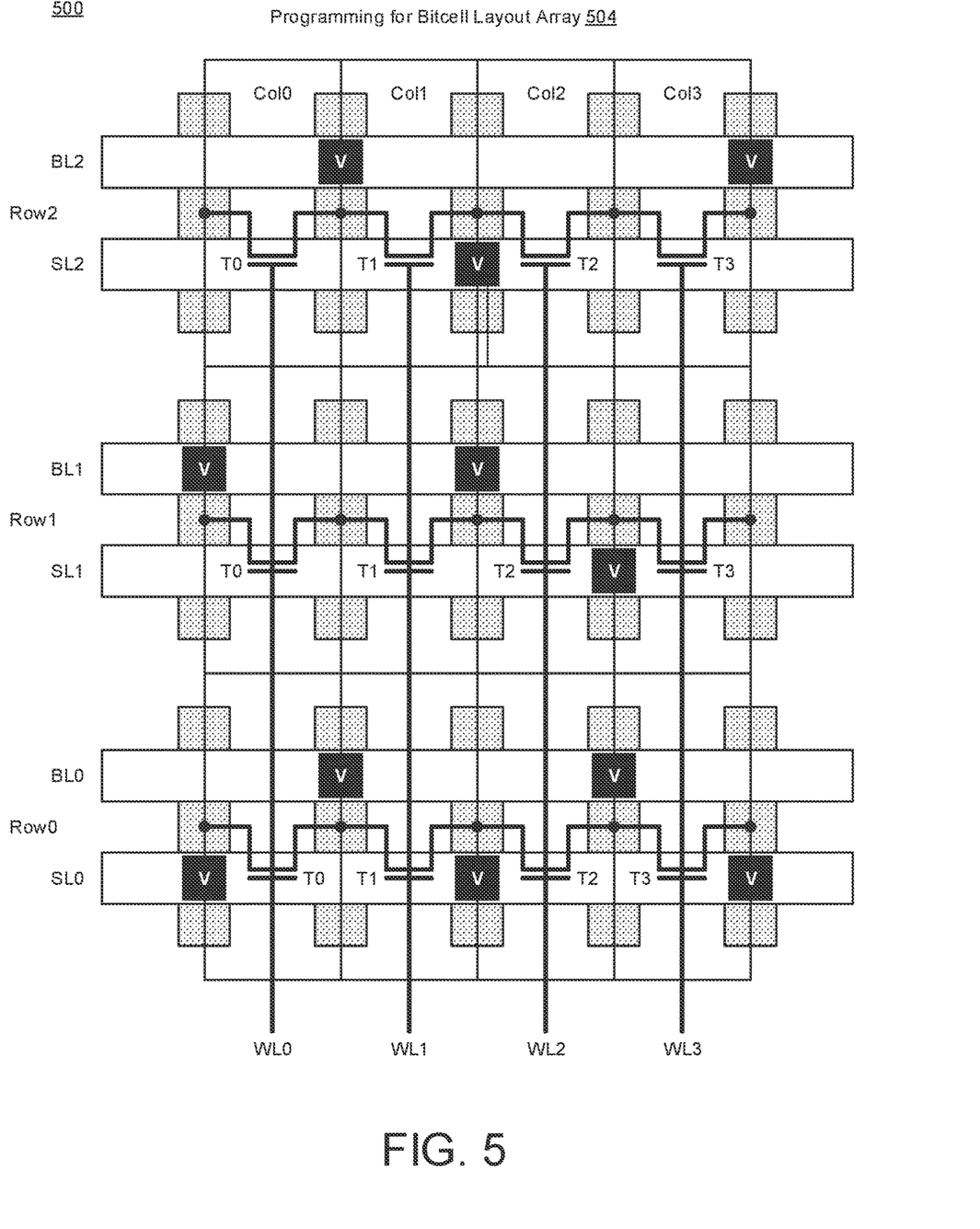
FIG. 5 illustrates a diagram of programming for a bitcell layout array with via masking in accordance with various implementations described herein.

FIG. 5 illustrates a diagram 500 of programming for a bitcell layout array 504 with via masking in accordance with various implementations described herein.

In various implementations, the bitcell layout array 504 provides the via marking layer (VML) for fabricating a bitcell array as a via memory device with various integrated circuit (IC) components arranged and coupled together as an assemblage or combination of parts that provide for physical circuit designs and various related structures. In various instances, a method of designing, providing and fabricating the bitcell layout array 504 as an integrated device may involve use of various IC circuit components and/or structures described herein so as to thereby implement various via masking techniques associated therewith. Also, the bitcell layout array 504 may be integrated with memory circuitry and related components on a single chip, and the bitcell layout array 504 may be implemented in embedded devices for automotive, mobile, computer, server and IoT applications.

As shown in FIG. 5, the bitcell layout array 504 may include multiple bitcells having at least one transistor (T0, T1, T2, T3) arranged in columns (Col0, Col1, Col2, Col3) and rows (Row0, Row1, Row2, Row3). In a first column (Col0), a first wordline (WL0) may be coupled to the gates of transistors (T0) in rows (Row0, Row1, Row2). In a second column (Col1), a second wordline (WL1) may be coupled to the gates of transistors (T1) in rows (Row0, Row1, Row2). Also, in a third column (Col2), a third wordline (WL2) may be coupled to the gates of transistors (T2) in rows (Row0, Row1, Row2). Also, in a fourth column (Col3), a fourth wordline (WL3) may be coupled to the gates of transistors (T3) in rows (Row0, Row1, Row2). In various instances, the bitcell layout array 504 may have any number of columns and rows and also any number of transistors.

In various implementations, the via marking layer (VML) is used to program the bitcells in the bitcell layout array 504. In some applications, the configuration of bitcells in the columns and rows may provide for 3 rows of 4 bits each, wherein each row may be separately programmed with the same or different 4-bit sequence. For instance, as shown in FIG. 5, Row0 may be programmed as 1111, Row1 may be programmed as 0010, and Row2 may be programmed as 0100. However, in various other instances, each row (Row0, Row1, Row2) may be programmed with any 4-bit sequence.

Figure 6:
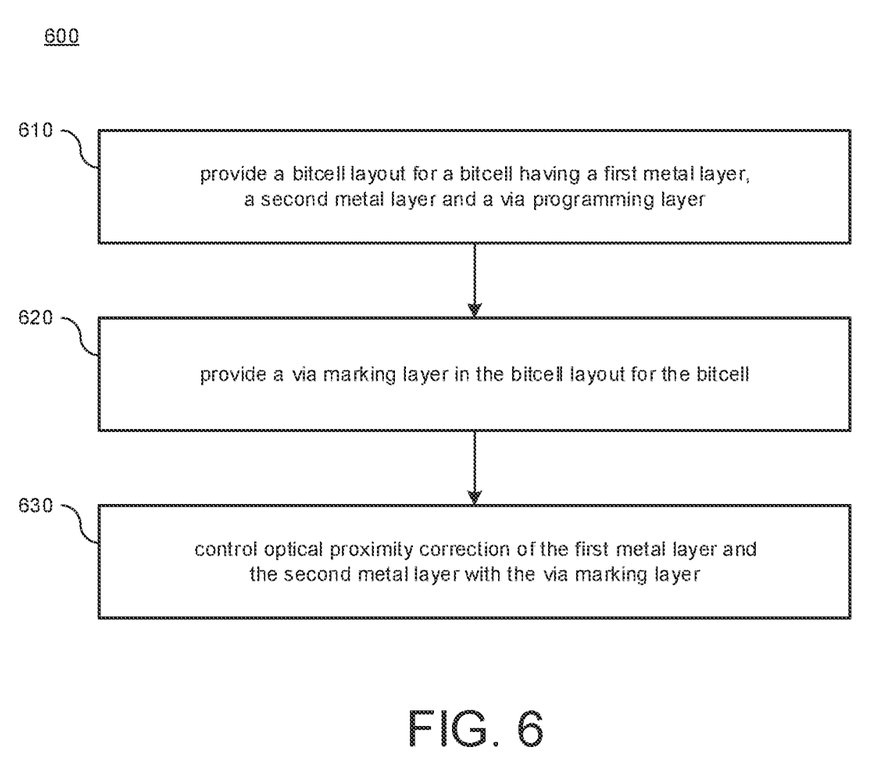
FIG. 6 illustrates a process diagram of a method for providing a bitcell layout with a via marking layer in accordance with implementations described herein.

FIG. 6 illustrates a diagram 600 of a method for providing a bitcell layout with a via marking layer in accordance with implementations described herein.

It should be understood that even though the method 600 indicates a particular order of operation execution, in some instances, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in FIGS. 1A-1B, 2-3, 4A-4B and 5-6. Also, if implemented in software, method 600 may be implemented with program and/or software instruction processes configured for providing bitcell layout with via masking, as described herein. Also, if implemented in software, instructions related to implementing the method 600 may be stored in memory and/or a database. In various instances, a computer or various other types of computing devices having a processor and memory may be configured to perform method 600.

In various implementations, method 600 may refer to a method for designing, providing, fabricating and/or manufacturing bitcell layout architecture with via masking as an integrated system, device and/or circuit that involves use of various circuit components described herein so as to implement via masking techniques associated therewith. Also, bitcell layout architecture may be integrated with computing circuitry and various related components on a single chip, and also, the bitcell layout architecture may be implemented in various embedded systems for various electronic, mobile and IoT applications.

At block 610, method 600 may provide a bitcell layout for a bitcell having a first metal layer, a second metal layer and a via programming layer. At block 620, method 600 may provide a via marking layer in the bitcell layout for the bitcell. Also, at block 630, method 600 may control optical proximity correction of the first metal layer and the second metal layer with the via marking layer. In some instances, controlling the optical proximity correction of the first metal layer and the second metal layer the via marking layer includes decoupling the optical proximity correction of the first metal layer and the second metal layer from the via programming layer.

In various implementations, method 600 may program or reprogram the bitcell with masks, and also, the masks used to program or reprogram the bitcell may have one or more masks for the via programming layer without using any masks for the first metal layer and/or without using any masks for the second metal layer. Also, in some instances, during programming or reprogramming the bitcell, method 600 may form one or more vias in the bitcell between the first metal layer and the second metal layer by way of the single via programming mask provided in the bitcell layout. Also, in some instances, method 600 may form and/or dispose the via marking layer between the first metal layer and the via programming layer. Also, method 600 may form and/or dispose the first metal layer below the second metal layer, and in addition, method 600 may form and/or dispose the via programming layer between the via marking layer and the second metal layer.

Advantageously, various via masking schemes and techniques are provided herein for various memory related applications in physical circuit designs. Also, in some implementations, various via masking schemes and techniques described herein provide for a novel bitcell layout that uses a via marking layer to reduce a number of metal masks needed for forming metal layers for programming and/or reprogramming a bitcell. In some applications, various via masking schemes and techniques described herein may provide for some memory masking techniques that reduce a number of programming masks for various types of via memory, including, e.g., via ROM (via read-only memory). Thus, the via masking schemes and techniques described herein provide for reducing the number of programming masks for metal layers in various memory based applications.

Described herein are various implementations of a device having a bitcell with a bitcell layout including a first metal layer, a second metal layer and a via programming layer. The device may have a via marking layer provided in the bitcell layout for the bitcell, and the via marking layer controls optical proximity correction of the first metal layer and the second metal layer.

Described herein are various implementations of a device having a first metal layer provided in a bitcell layout for a bitcell with a first metal mask. The device may have a via programming layer provided in the bitcell layout for the bitcell with a single via programming mask. The device may have a second metal layer provided in the bitcell layout with a second metal mask. The device may have a via marking layer provided in the bitcell layout, wherein the via marking layer controls optical proximity correction of the first metal layer and the second metal layer.

Described herein are various implementations of a method. The method may provide a bitcell layout for a bitcell having a first metal layer, a second metal layer and a via programming layer. The method may provide a via marking layer in the bitcell layout for the bitcell. The method may control optical proximity correction of the first metal layer and the second metal layer with the via marking layer.

It should be intended that the subject matter of the claims may not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various related techniques described herein, other and further implementations may be devised in accordance with the disclosure herein, which may be determined by the claims that follow.

Although the subject matter has been described herein in language specific to structural features and/or methodological acts, it should be understood that the subject matter defined in the appended claims is not necessarily limited to the specific features or acts described above. Rather, specific features and acts described above are disclosed as example forms of implementing the claims.

What is claimed is:

1. A device comprising:
    a bitcell having a bitcell layout with a first metal layer, a second metal layer and a via programming layer; and
    a via marking layer provided in the bitcell layout for the bitcell, wherein:
        the via marking layer defines one or more possible positions of a programming via; and
        optical proximity correction (OPC) for the first metal layer and the second metal layer is performed based on the defined one or more possible positions.

2. The device of claim 1, wherein the via marking layer separates the OPC for the first metal layer and the second metal layer from dependence on the via programming layer.

3. The device of claim 1, wherein masks used to program or reprogram the bitcell include one or more masks for the via programming layer without any masks for the first metal layer and without any masks for the second metal layer.

4. The device of claim 1, wherein one or more vias are formed during programming or reprogramming the bitcell between the first metal layer and the second metal layer with the via programming layer provided in the bitcell layout.

5. The device of claim 1, wherein the via marking layer is disposed between the first metal layer and the via programming layer.

6. The device of claim 5, wherein the first metal layer is disposed below the second metal layer, and wherein the via programming layer is disposed between the via marking layer and the second metal layer.

7. A device comprising:
    a first metal layer provided in a bitcell layout for a bitcell with a first metal mask;
    a via programming layer provided in the bitcell layout for the bitcell with a single via programming mask;
    a second metal layer provided in the bitcell layout with a second metal mask; and
    a via marking layer provided in the bitcell layout, wherein;
        the via marking layer defines one or more possible positions of a programming via; and
        optical proximity correction (OPC) for the first metal layer and the second metal layer is performed based on the defined one or more possible positions.

8. The device of claim 7, wherein the via marking layer enables usage of a single programming mask for programming of the bitcell by defining one or more possible positions of a programming via.

9. The device of claim 8, wherein the via marking layer enables programming of the bitcell using only the single via programming mask for the via programming layer.

10. The device of claim 7, wherein the via marking layer separates the OPC for the first metal layer and the second metal layer from dependence on the via programming layer.

11. The device of claim 7, wherein masks used to program or reprogram the bitcell include one or more masks for the via programming layer without any masks for the first metal layer and without any masks for the second metal layer.

12. The device of claim 7, wherein one or more vias are formed during programming or reprogramming the bitcell between the first metal layer and the second metal layer with the via programming layer provided in the bitcell layout.

13. The device of claim 7, wherein the via marking layer is disposed between the first metal layer and the via programming layer.

14. The device of claim 13, wherein the first metal layer is disposed below the second metal layer, and wherein the via programming layer is disposed between the via marking layer and the second metal layer.

15. A method comprising:
providing a bitcell layout for a bitcell having a first metal layer, a second metal layer and a via programming layer; and
providing a via marking layer in the bitcell layout for the bitcell,
defining, by the via marking layer, one or more possible positions of a programming via, wherein:
optical proximity correction (OPC) for the first metal layer and the second metal layer are performed based on the defined one or more possible positions.

16. The method of claim 15, further comprising:
separating, by the via marking layer, the OPC for the first metal layer and the second metal layer from dependence on the via programming layer.

17. The method of claim 15, further comprising:
programming or reprogramming the bitcell with masks, wherein the masks used to program or reprogram the bitcell include one or more masks for the via programming layer without any masks for the first metal layer and without any masks for the second metal layer.

18. The method of claim 15, further comprising:
during programming or reprogramming the bitcell, forming one or more vias in the bitcell between the first metal layer and the second metal layer by way of the via programming layer provided in the bitcell layout.

19. The method of claim 15, further comprising:
forming and disposing the via marking layer between the first metal layer and the via programming layer.

20. The method of claim 19, further comprising:
forming and disposing the first metal layer below the second metal layer, and
forming and disposing the via programming layer between the via marking layer and the second metal layer.

* * * * *